United States Patent [19]

Bartholomew

[11] 4,006,388
[45] Feb. 1, 1977

[54] THERMALLY CONTROLLED ELECTRONIC SYSTEM PACKAGE

[75] Inventor: Wesley E. Bartholomew, Palos Verdes, Calif.

[73] Assignee: Hughes Aircraft Company, Culver City, Calif.

[22] Filed: Mar. 3, 1975

[21] Appl. No.: 554,789

[52] U.S. Cl. .................. 317/100; 317/101 DH; 174/16 R
[51] Int. Cl.² .................................. H05K 7/20
[58] Field of Search ..... 317/100, 101 CB, 101 DH; 165/80, 105; 174/16 R, 16 HS; 312/330 R, 330 SM; 62/418

[56] References Cited

UNITED STATES PATENTS

| | | | |
|---|---|---|---|
| 3,298,195 | 1/1967 | Raskhodoff | 174/16 R |
| 3,395,318 | 7/1968 | Laermer | 317/101 DH |
| 3,648,113 | 3/1972 | Rathjen | 317/100 |
| 3,706,010 | 12/1972 | Laermer | 317/100 |
| 3,771,023 | 11/1973 | Hollingshead | 317/100 |
| 3,790,859 | 2/1974 | Schraeder | 317/100 |
| 3,851,130 | 11/1974 | Paulson | 317/100 |

*Primary Examiner*—Gerald P. Tolin
*Attorney, Agent, or Firm*—Lewis B. Sternfels; W. H. MacAllister

[57] ABSTRACT

A plug-in module, for supporting such electronic devices as an LSI circuit wafer, hybrid electronics, and/or discrete components, includes a ceramic base, the electronic devices mounted on one side of the base, a corrugated cooling fin bonded to the other side of the base, a printed circuit board secured to the far side of the cooling fin, a terminal strip connector at the base edge, a crossover electrically interconnecting the two module sides, and a supporting slotted frame onto which the ceramic base and printed wiring board are bonded. The terminal strip connector is secured to the frame with screws. Circuit leads from the ceramic base are soldered directly to the terminal strip connector and also are interconnected to the terminal strip by means of soldered crossover leads and vertical conductor lines on the printed circuit board. If the module's electronic function so requires, further electronic devices may be placed on the printed circuit board. Cooling air for the module is introduced from a unit chassis plenum through the slots passing into one edge of the frame so that air traverses through the fin to cool the package and by conduction, a circuit wafer or other heat dissipating devices mounted therein, and the air emerges through the slots in the opposite frame side. Modules are designed to be inserted into closely spaced card guides which may be provided with apertured strips for controlling the rate of flow of coolant passing through the fin.

14 Claims, 12 Drawing Figures

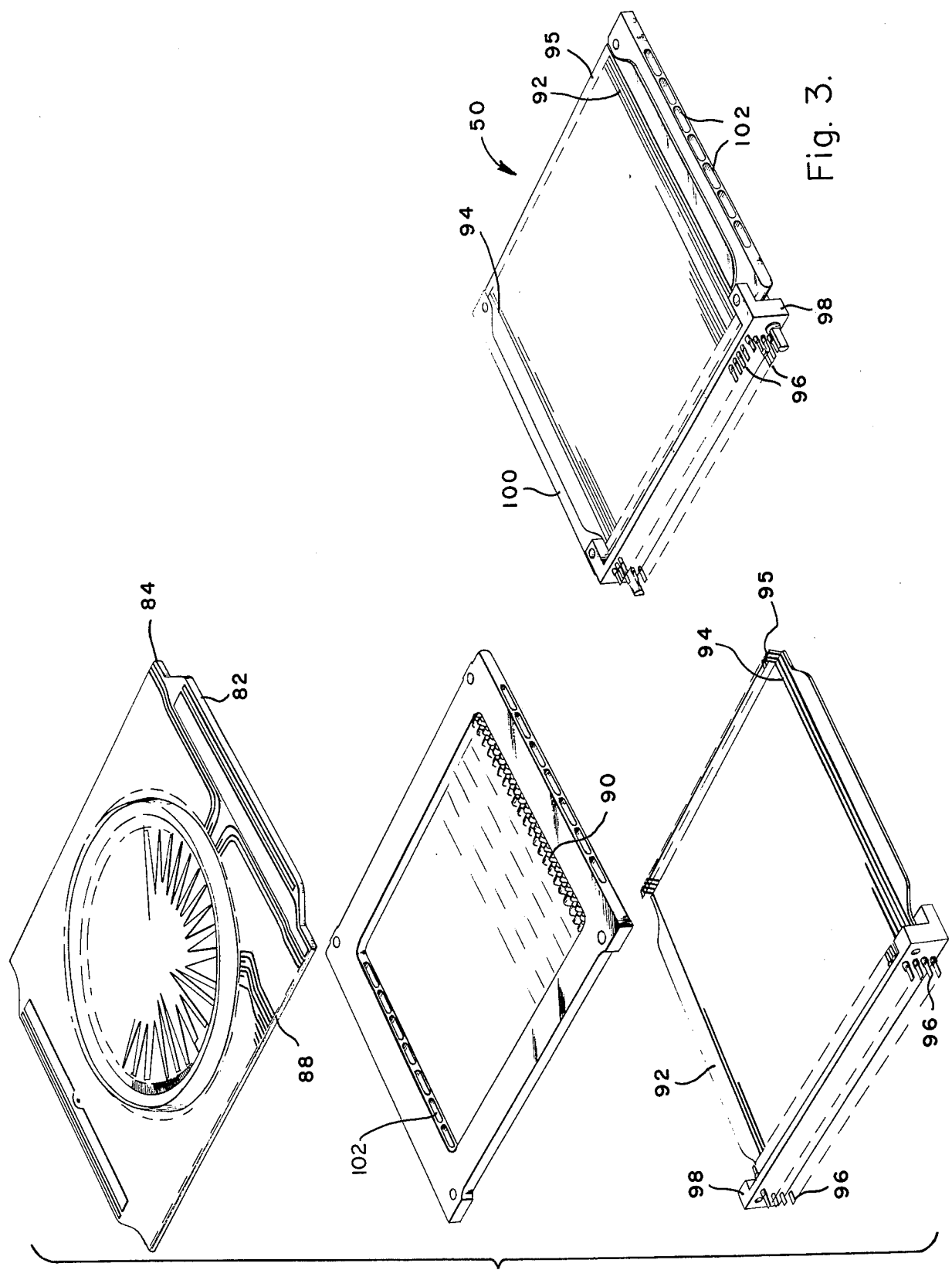

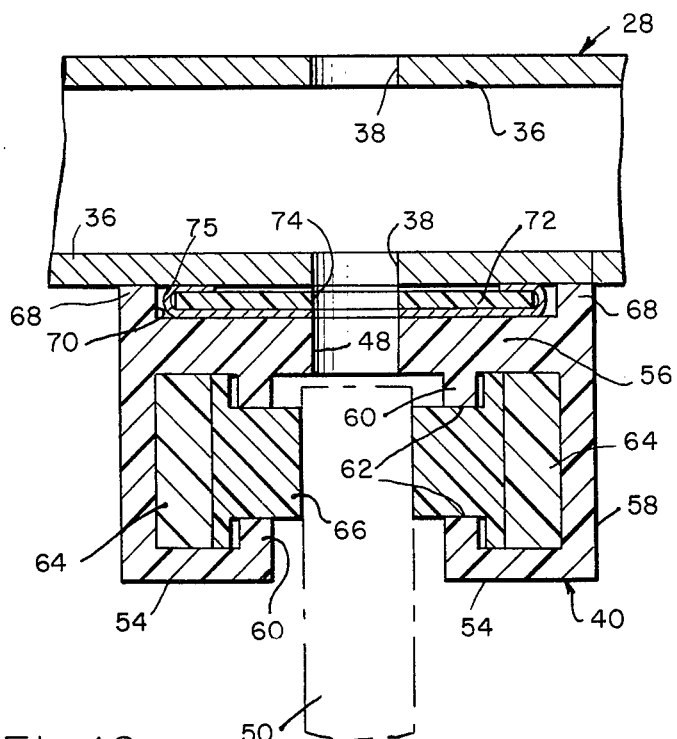
Fig. 10.
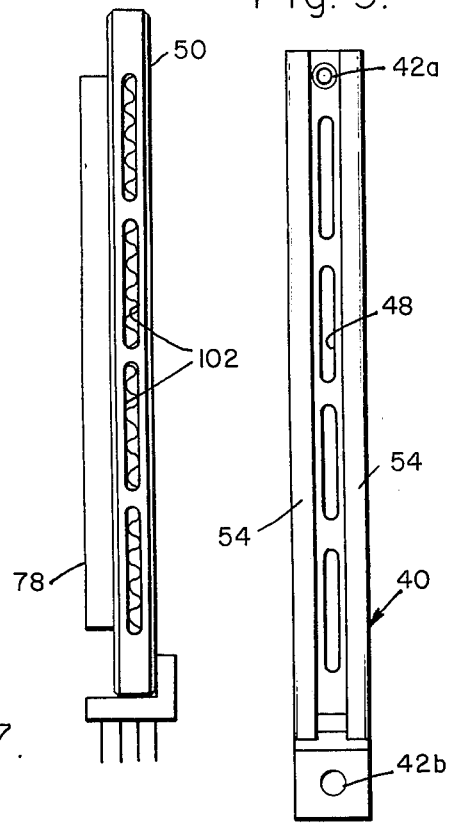
Fig. 9.
Fig. 7.
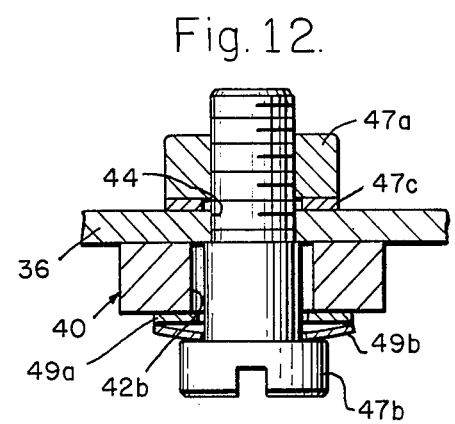
Fig. 12.
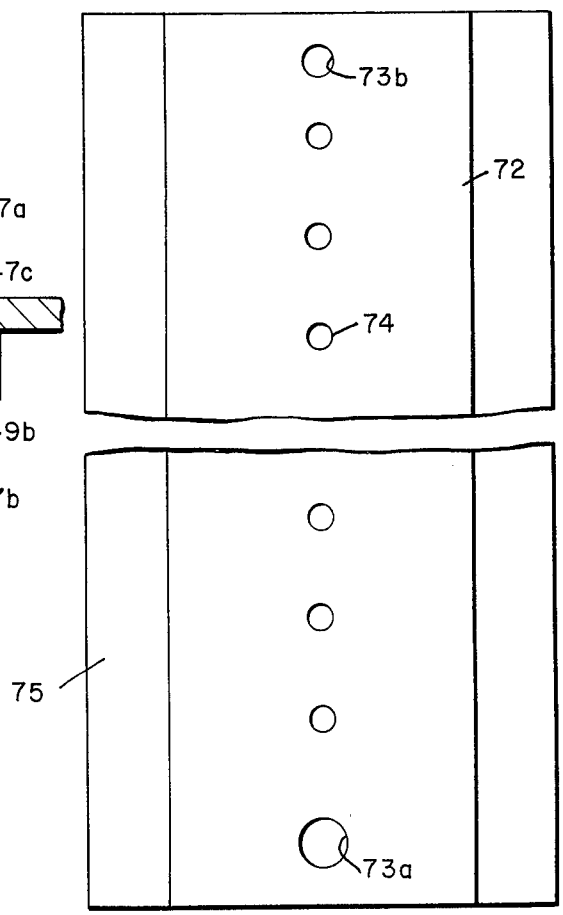
Fig. 11.

THERMALLY CONTROLLED ELECTRONIC SYSTEM PACKAGE

BACKGROUND OF THE INVENTION

1. Field of the Invention

The present invention relates to a heat exchanger package for complex, high-density and high-powered electronic devices and systems and, more particularly, to such a package comprising a number of modules each of which supports one or more electronic devices and which, when assembled together, includes an integral heat dissipating system.

2. Description of the Prior Art

Complex electronic systems have undergone considerable change in design from an assembly including the use of such structural members as angles, brackets, cold plates, heat sinks and other pieces of hardware to more integrated systems. Such pieces of hardware structurally integrate various electronic components of the system and generally form no part of the system itself; their existence by nature adds weight and bulkiness to the resulting assembly. In addition, such systems are relatively easy to cool since the components are sufficiently separated so that the power rating per cubic foot and the resulting generated heat is sufficiently low to permit the use of conventional heat exchanging means. Thus, such an electronic system was first designed and then adapted to some form of heat exchanging means.

With the increasing need for lightweight systems, it has been found necessary to incorporate the structural hardware into as close adjacency with the electronic components and circuitry as is possible. Examples of such prior art systems are shown in U.S. Pat. Nos. 3,411,041, 3,395,318 and 3,648,113. In all of these systems, heat is removed by flowing coolant around or through the electronic components and there may be several structural elements interposed between the electronic components and the coolant, thereby resulting in relatively poor thermal conductivity from the components to the coolant. In part, this thermal dissipation problem results from the requirement to electrically interconnect the components, one with another. In some cases, components are mounted on a board which is then placed on a thermally conductive surface from which the heat is conducted to the coolant. As the number of components increases, the number of interconnecting leads correspondingly increase, which may require placing leads on both sides of supporting member with numerous circuit interlayers. Because all these leads must be insulated one from the other, such insulation deleteriously affects thermal conductivity and impedes heat flow from the components to the cooling surface.

SUMMARY OF THE INVENTION

The present invention overcomes these and other problems by providing one or more plug-in modules and assembly package thereof in which each module incorporates a substrate for mounting on one or both sides thereof electronic devices embodied as LSI circuit wafers, hybrid packages and/or discrete components. A cooling fin is bonded to the back face of the substrate and a printed circuit board or equivalent is affixed to the other side of the corrugated cooling fin to provide a sandwich configuration comprising the substrate with its electronic devices thereon, the cooling fin, and the printed circuit board. If needed, further electronic devices may be incorporated on the printed circuit board.

At the side edges of the sandwich structure are a pair of card guides secured to the unit chassis plenums with orifices therein for metering coolant to the cooling fin. A terminal strip or connector is secured to the bottom or base edge of the sandwich structure for electrically coupling the module with other modules and/or other electronic devices, and a plurality of crossover electrical connector lines are positioned at the top edge of the sandwich structure to form interconnections from the electronic devices to the printed circuit board. Both the leads on the printed circuit board and printed circuits on the substrate connect the electronic devices to the base terminal strip. Coolant for the module is introduced from a plenum through slots in one frame side, so that the coolant traverses through the apertured strip, thence through the fin to cool the electronic devices by conduction, and emerges through slots in the opposite frame side. The modules are insertable into closely spaced card guides to achieve high packaging density. The guides where coolant is introduced from the plenum may include apertured strips for preselected control of the rate of flow of the coolant through the module.

It is, therefore, an object of the present invention for providing a novel carrier mechanism for mounting electronic devices of high thermal dissipation.

Another object is to provide a means for exceptionally efficient low pressure, high coolant flow through the structure mounting the electronic devices, at a low pressure drop in the coolant fluid.

Another object is to provide for high reliability performance of electronic devices under severe environmental conditions.

Another object is for providing reduced module manufacturing cost while retaining the lowest possible volume and weight thereof.

Another object is to provide for means for utilizing conventional manufacturing processes for fabrication of a heat exchanger package for high-density high-powered electronic modules.

Another object is to provide for efficient space utilization without sacrifice of cooling capabilities.

Another object is to provide for enhanced electronic module strength and ruggedness.

Another object is to provide for mounting of module electronic devices to prevent undue stress from being exerted thereon or on supporting structure, especially at the edges of any ceramic materials, when the module is subjected to severe mechanical vibration and shock during use thereof.

Another object is to provide for facilitated module insertion into a package system.

Another object is to provide for flexibility and adaptability for electrical circuitry by any desired conductor pattern in multilayer substrate design.

Other aims and objects as well as a more complete understanding of the present invention will appear from the following explanation of exemplary embodiments and the accompanying drawings thereof.

Figure 1:
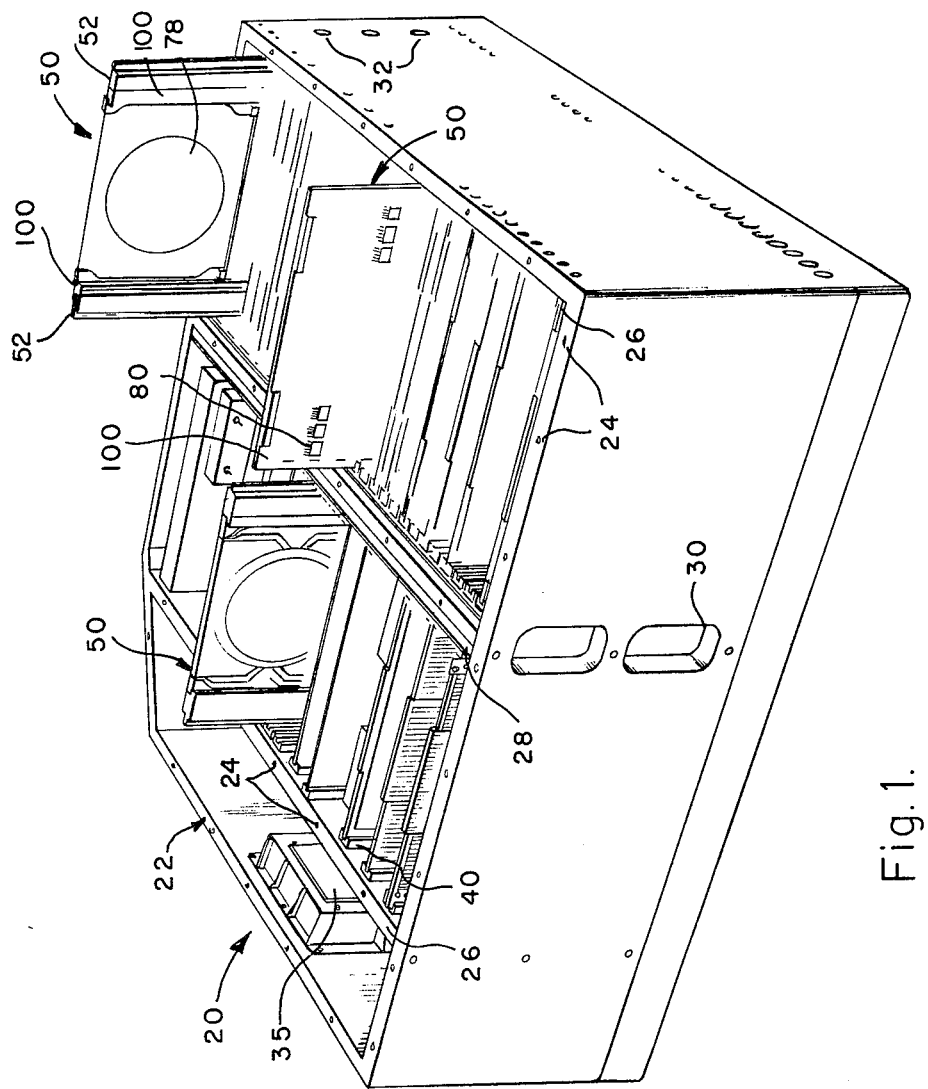
FIG. 1 depicts an electronic system and package embodying the present invention sketched from (Hughes Aircraft Company photograph No. 74-29520 dated Aug. 27, 1974, copy attached on page 22 hereof)
Figure 2:
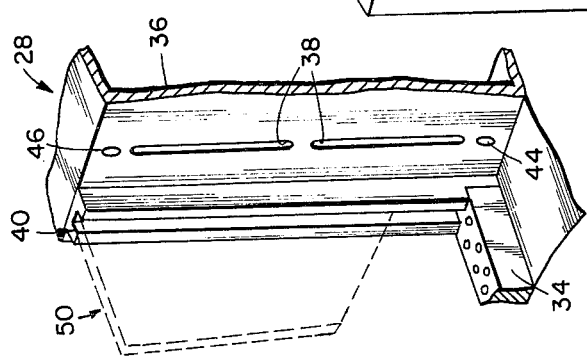
Figure 8:
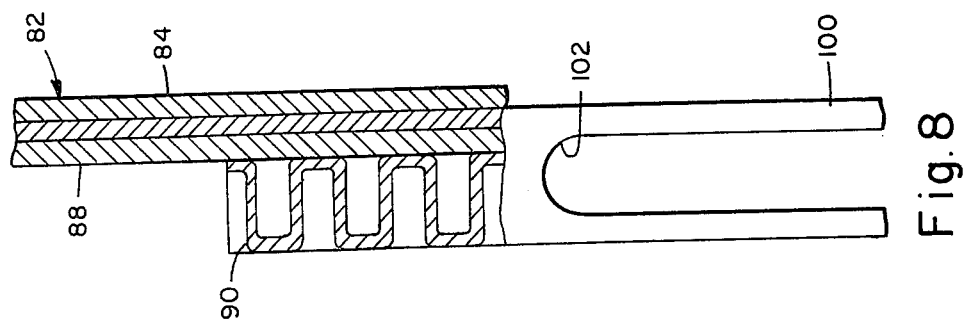
Figure 5:
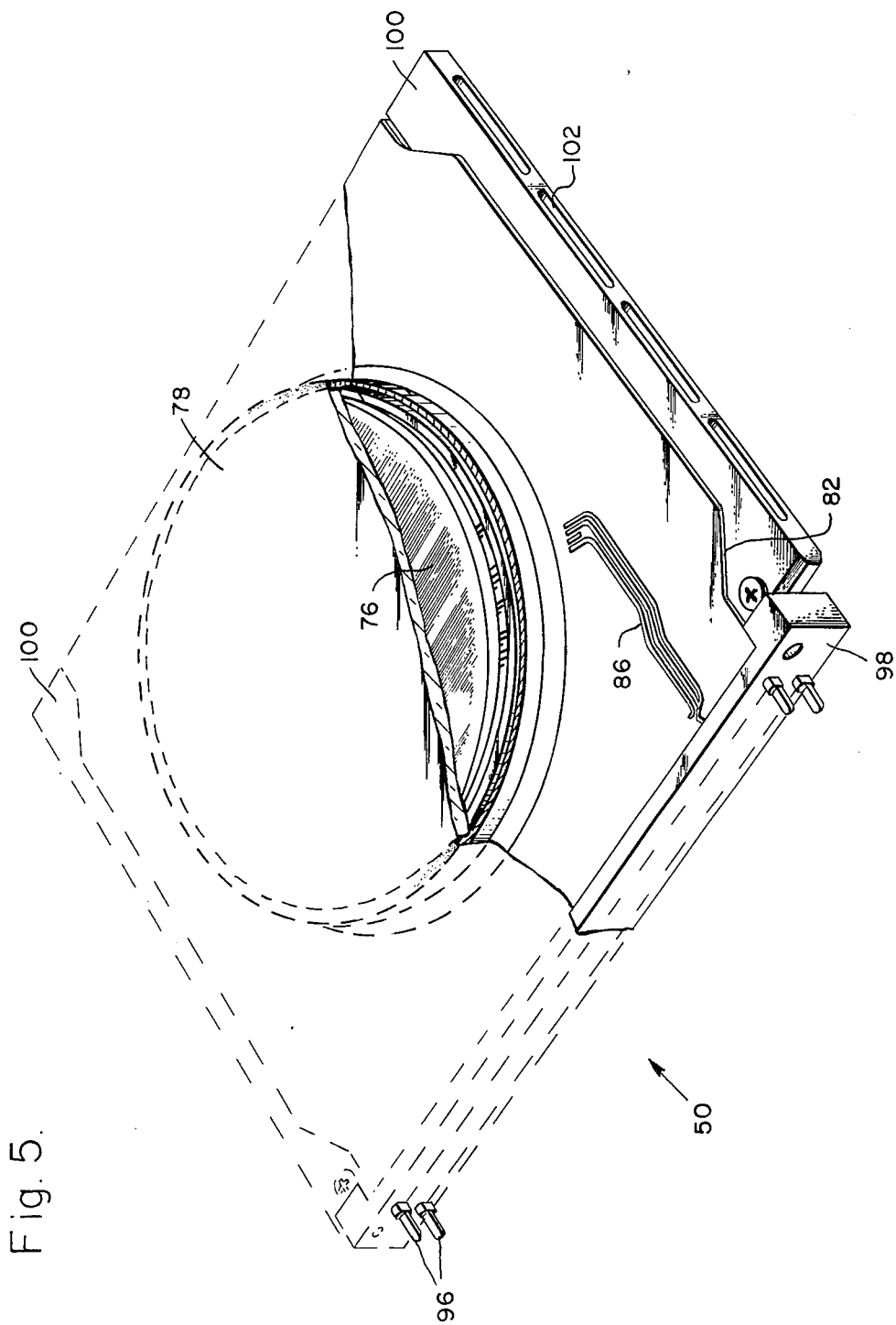
Figure 6:
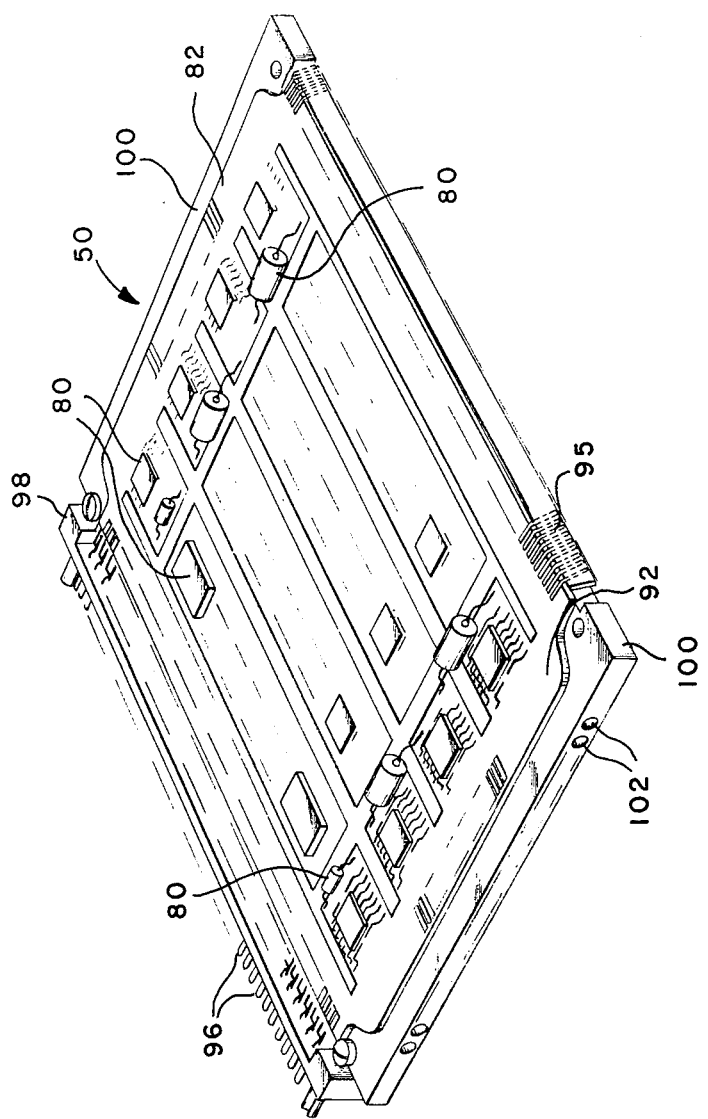

FIG. 2 is a fragmentary view of a portion of the system depicted in FIG. 1 showing certain inner details thereof;

FIG. 3 depicts a rear view of a module whose front view is illustrated in FIG. 5 and which is insertable within the system depicted in FIGS. 1 and 2 sketched from Hughes Aircraft Company photograph No. 74-24547 dated Feb. 6, 1974, copy of composite photograph including FIG. 4 attached on page 23 hereof);

FIG. 4 is an exploded view of a portion of the module shown in FIG. 5, showing the cooling fin detached for clarity (respectively sketched from Hughes Aircraft Company photograph Nos. 74-24541, 74-24551 and 74-24548, all dated Feb. 6, 1974, copy of composite photograph including FIGS. 3 and 5 attached on page 23 hereof);

FIG. 5 is a front view of the module depicted in FIG. 3 but enlarged (sketched from Hughes Aircraft Company photograph No. 74-24542, dated Feb. 6, 1974, copy of composite photograph including FIG. 4 attached on page 23 hereof);

FIG. 6 illustrates a view of a module embodying the present invention with discrete circuit components mounted thereon sketched from (Hughes Aircraft Company photograph No. 73-19436 dated Apr. 23, 1973, copy attached on page 24 hereof);

FIG. 7 is an end view of any of the modules depicted in FIGS. 3, 5 and 6;

FIG. 8 illustrates a detail in partial section of any of the modules of FIGS. 3, 5, 6 and 7;

FIG. 9 depicts a single guide used in supporting a module within the system of FIGS. 1 and 2;

FIG. 10 is a cross-sectional view of a portion of the central plenum and one of the guides of FIG. 9 showing reception therein of one edge of a module;

FIG. 11 depicts a portion of a strip prior to being inserted in its position as shown in FIG. 10 for controlling the rate of flow of coolant passing through a module; and FIG. 12 shows the mechanism by which the module and seal can be automatically aligned with the interconnection plate when the module is inserted into the unit chassis structure.

DESCRIPTION OF THE PREFERRED EMBODIMENTS

Accordingly, with reference to FIGS. 1 and 2, an electronic system 20 for providing some very large electronic function, e.g., a signal processor, is housed within a chassis 22 which, in order to show its interior, has its lid removed, although screw holes 24 are shown for attachment of a lid thereto. The chassis comprises an integral structure which defines three plenums shown as outer plenums 26 and a centrally placed plenum 28; however, a greater or lesser number of plenums may be used, as needed. Air or other coolant is designed to be furnished to central plenum 28 through an entry 30 and to be exhausted from outlets 32. It is to be understood, of course, that any other form of coolant entries and outlets may be provided wherever it is necessary in order to provide for an adequate flow of coolant fluid through the chassis.

Positioned on the base of chassis 22 are a plurality of electrical contact receptacles 34, of which one is illustratively shown in FIG. 2, for integrating all electronic devices into the desired electronic function. A receptacle 35 (see FIG. 1) is adapted to electrically couple system 20 with other systems into some larger electronic function.

Each plenum is provided with spaced walls 36 (see also FIG. 10), with both walls 36 of plenum 28 having holes 38 therein, while one wall 36 of each plenum 26 facing central plenum 28 has similar holes therein. Holes 38 may be of any desired configuration, depending upon the designed cooling requirements.

Secured to each of walls 36 having holes 38 therein are a plurality of elongate guides or brackets 40, of which one only is shown in FIGS. 9 and 10. Guides 40 may be secured to apertured walls 36 in any convenient manner, such as by nuts and bolts or machine screws extending through holes 42a and 42b (FIGS. 9 and 12) of guides 40 and holes 44 and 46 in apertured walls 36 (FIG. 2). As best shown in FIGS. 2, 9 and 12, holes 42a, 42b, 44 and 46 are illustrated as substantially circular, with holes 42b oversized to provide a clearance between the screw and the bottom end of the module guide, thus permitting slight pivotal movement of guides 40 when the modules are placed therein in case of misalignment between facing guides or assembly misalignment between the plenums and the interconnection plate, or to compensate for slightly warped modules. It is to be understood, of course, that any of the holes may take any configuration to provide the desired pivotal movement.

In the preferred configuration shown in FIG. 12, the mechanism for achieving the desired float at the bottom end of guides 40 comprises a fastener, configured as a nut 47a, bolt 47b and lock washer 47c having a flat washer 49a and a spring washer 49b which forces guide 40 against plenum wall 36 when the fastener shank is seated against hole 44.

Each of guides 40 have coolant flow holes 48 therein which are adapted to be aligned in communication with holes 38 and in apertured walls 36. It is to be understood that holes 38 and 48 may be of any configuration which is suitable for permitting substantially uninterrupted flow of fluid therethrough and, therefore, may take the form of elongated slots, as shown, or circular holes or any other configuration or combination of opening configurations as is required.

Received within guides 40 are a plurality of modules 50 which may take one of several configurations as illustratively shown in FIGS. 1 and 3-7. As shown, particularly with reference to FIG. 1, modules 50 may fit directly within guides 40 or, if the width from one side edge to the other side edge is less than the width between facing guides 40, adaptor extensions 52 with coolant conduits therein may be used to obtain the proper fitting of the modules within chassis 22. Regardless of the direct or indirect placement of modules within guides 40, as shown in FIGS. 9 and 10, the guides have a general U-shaped cross-sectional configuration which defines a pair of facing sides 54 also of generally U-shaped cross-section. Sides 54 are joined by a center portion 56 through which openings or apertures 42a, 42b and 48 extend. Each of U-shaped sides 54 includes a base 58 and a pair of spaced ridges or lips 60 which face one another and extend substantially parallel to base 58 to define an elongate slot 62 which faces a similar slot 62 on the other of sides 54. A strip of resilient elastomeric material 64 is positioned against the interior of each of bases 58 and a generally T-shaped strip is substantially non-rigid, low friction material 66 is positioned against each of elastomeric strips 64 and extends outside of each of elongate slots 62 in order to resiliently support modules 50 or extensions 52 at their sides and to provide a seal.

Guides 40 further includes a pair of longitudinally extending ridges 68 at the edge of portion 56 extending towards and contacting apertured plenum wall 36. Ridges 68 are placed on either side of holes 48 to define an elongated cavity 70 defined by ridges 68, center portion 56, and apertured plenum wall 36. Within cavity 70 may be placed a strip 72 of any suitable material, such as metal or epoxy glass (see also FIG. 11). Strip 72 has holes 73a and 73b matching plenum holes 42a and 42b and coolant flow holes 74 therein whose opening size is at most equal to that of guide holes 48 and plenum wall holes 38. Metering strip 72 is preferably installed in its place by use of a two-sided adhesive strip 75, such as of polyimide, which is first adhered to the metering strip which is then placed against the guide wall between ridges 68, with attention being given to proper alignment of strip holes 73a, 73b and 74 with respective guide holes 42a, 42b and 48. The extending sides of the adhesive strip are then folded over, as shown in FIG. 10, and the guide is attached to plenum wall 36 by fasteners, including the assemblage depicted in FIG. 12, as previously described. By designing a particular hole size 74, the rate of flow of the coolant may be preset to whatever value is desired. Preferably, coolant flow controlling strip 72 is positioned adjacent walls 36 of the center plenum 28; however, they may be placed next to walls 26, if desired.

Referring now to FIGS. 3–7, modules 50 may be used to support electronic devices of any desired nature. Modules 50 of FIGS. 3–5 and 7 are used to support primarily a large scale integrated (LSI) wafer 76 (see FIG. 5) housed within a package 78. The specifics of packaging of LSI wafer 76 are more completely and specifically described in copending patent application Ser. No. 554,788 filed herewith entitled "Package for Hermetically Sealing Electronic Circuits" by Louis E. Gates Jr. It is to be understood, however, that any other form of packaging may be used. Alternatively, the electronic components, as shown in FIG. 6, may comprise discrete devices 80 and/or hybrid packages, for example, as more fully described in copending patent application Ser. No. 554,788 filed herewith entitled "Large Area Hybrid Microcircuit Assembly" by Robert Y. Scapple, Frank Z. Keister, Robert G. Grieger and Richard P. Himmel. All types of modules depicted in FIGS. 5 and 6 are capable of placement into the structure of FIG. 1.

In all cases, module 50 (see also FIG. 8) comprises a substrate 82, preferably of ceramic material such as of alumina, having on its front side 84 a circuit package 78, discrete devices 80, and/or hybrid circuits, with a plurality of printed circuit patterns 86 directly on and-/or under its surface.

Bonded to the back side 88 of ceramic substrate 82, as best shown in FIGS. 4 and 8, is a corrugated or otherwise formed cooling fin 90. The preferable bonding means is by brazing or soldering; however, it is to be understood that any other secure fastening means may be used so long as a good thermal path is obtained. Further secured to cooling fin 90 at the back side of wafer 50 is a printed circuit board 92 having thereon a printed pattern of leads 94 alone on one or both sides thereof and adquately insulated, or, if the electronic function so requires, a circuit pattern and a plurality of further devices configured as an LSI wafer and package, discrete devices, and/or hybrid electronic packages. In any case, connecting leads configured as U-shaped strips 95, as best seen in FIG. 6, connect some or a portion of the devices on ceramic substrate 82 with any devices and leads 94 on printed circuit board 92, and both printed circuit patterns 86 and 94 extend to a plurality of contact pins 96 disposed within a pin receptacle connector 98. Pins 96 are disposed to mate and electrically contact with sockets within electrical contact receptacle 34 shown in FIG. 2.

Each module is completed at its side edges by a frame member 100 which is secured to connector 98, substrate base 82 and printed circuit board 92 in any suitable manner. Frame members 100 have a plurality of apertures or holes 102 which provide communication from fins 90 to the exterior of modules 50 and, in particular, to holes 48 of guides 40 and holes 38 of plenum walls 36 so as to provide ingress and egress of coolant into and from the modules. Openings 102 may be of any suitable configuration such as slots, as shown in FIGS. 3 and 5 or as circular holes as shown in FIG. 6. Again, holes 102 are configured in a manner to provide the most efficient cooling under the circumstances required.

Although the invention has been described with a reference to particular embodiments thereof, it should be realized that various changes and modifications may be made therein without departing from the spirit and scope of the invention.

What is claimed is:

1. A carrier mechanism for mounting electronic devices, such as large scale integrated wafers, hybrid packages and discrete components, and for high thermal dissipation of heat generated by such electronic devices comprising:

a chassis including integral structure for defining electrical contact receptacles and at least first and second plenums positioned in substantially parallel spaced alignment and separated from one another, said first plenum having means including spaced walls for receiving a coolant and said second plenum having means including spaced walls for exhausting the coolant, with one of said plenum walls of each of said first and second plenums opposing one another and having therein plenum wall holes facing one another respectively for receiving and exhausting the coolant, said electrical contact receptacles extending substantially between said opposing plenum walls having said plenum wall holes therein;

a plurality of elongate guides secured to said plenum walls over said plenum wall holes, each comprising a pair of elongate receptacles of substantial U-shaped cross-sectional configuration facing one another and having guide holes therein aligned in communication with said plenum wall holes; and a plurality of electronic modules supporting said electronic devices and slidably received in and between said facing U-shaped modules, each of said electronic modules including a mounting substrate of electrically insulating, high thermal conducting material having a generally rectangular configuration bounded by substantially parallel top and bottom edges, by a pair of substantially parallel side edges and by a pair of substantially parallel large area faces circumscribed by said edges, and having a plurality of contact pins extending along said bottom edge in electrical engagement with said electrical contact receptacles of said chassis, an electronic assembly of said electronic devices mounted on one of said large area faces and electrically coupled to said contact pins, a plurality of coolant fins directly secured to a second of said large area faces in high thermal contact therewith, and having coolant flow passages extending between said mounting substrate side edges, and a frame member secured to and supporting said mounting substrate around the periphery of its outer surface and received within said elongate guides, each of said frame members having therein openings aligned and communicating with said coolant flow passages and with said guide and plenum wall holes.

2. The carrier mechanism of claim 1 further including means defining upper and lower aligned openings in each of said plurality of elongate guides and said plenum walls, with attachments extending through respective ones of said aligned openings and securing said elongate guides to said plenum walls, one of each of said aligned openings being enlarged for permitting slight pivotal movement of said elongate guides for compensating for any physical distortions in or irregularly of said electronic modules or for any misalignment between said facing elongate guides or for any misalignment between said modules and said contact receptacles on said unit chassis.

3. The carrier mechanism of claim 1 further including coolant flow control means in said elongate guides positioned between said guide holes and said plenum wall holes for establishing a preset rate of flow of the coolant through said coolant flow passages.

4. The carrier mechanism of claim 3 wherein said coolant flow control means comprises a strip extending along substantially the length of said elongate guides and having therein holes of opening size at most as large as that of said openings of said frame members.

5. A thermal control package for an electronic system for thermal dissipation of heat generated by electronic devices in the electronic system comprising:

a support of high thermal conductance having a pair of opposed faces, said electronic devices being mounted on a first of said faces in direct thermal contract therewith;

coolant flow passages terminated by openings and mounted on a second of said faces in direct thermal contact therewith for collecting the heat generated by said electronic devices; and structural means coupled to said coolant flow passages for flowing coolant therethrough and for removing the heat collected thereby and including brackets supporting said support and having apertures aligned with said openings for establishing a conduit for the coolant through said coolant flow passages, and means in said brackets and positioned in the conduit established by said apertures and said openings for controlling the rate of flow of the coolant passing through said coolant flow passages.

6. The package of claim 5 wherein said rate of flow controlling means comprises a strip extending between said brackets and said openings and having holes of opening size at most as large as that of said openings.

7. The package of claim 5 further including frame members having therein said openings, said frame members being secured to said support for mounting said support and for aligning said openings with said coolant flow passages, thereby for providing receiving and exhaust ports for the coolant.

8. The package of claim 7 further including an electrical connector secured to said frame members, supporting said support, and electrically coupled to said electronic devices for effecting an electric coupling of said electronic devices with further electronic devices.

9. The package of claim 7 wherein said structural means includes a chassis supporting and electrically coupling said electronic devices with further electronic devices into the electronic system, said chassis having means receiving and exhausting the coolant and including said brackets supporting said frame members.

10. The package of claim 5 wherein said coolant flow passages comprise corrugated fin stock bonded to said second support face.

11. The package of claim 10 wherein said fin stock is brazed to said second support face.

12. The package of claim 5 wherein said support comprises ceramic.

13. A thermal control package for an electronic system for thermal dissipation of heat generated by electronic devices in the electronic system comprising:

a support of high thermal conductance having a pair of opposed faces and mounting said electronic devices on a first of said faces;

means mounted on a second of said faces in direct thermal contact therewith defining coolant flow passages for collecting the heat generated by said electronic devices;

means coupled to said coolant flow passages means for flowing coolant therethrough and for removing the heat collected thereby;

frame members having openings therein, said frame members being secured to said support for mounting of said support and for alignment of said openings with said coolant flow passages means, thereby for providing receiving and exhaust ports for the coolant; and a chassis supporting and electrically coupling said electronic devices with further electronic devices into the electronic system, said chassis having means for receiving and exhausting the coolant and including brackets secured to said chassis for supporting said frame members, said brackets having apertures aligned with said openings in said frame members for enabling passage of the coolant through said coolant flow passages means, each of said brackets at each of said frame members comprising an elongate guide of generally U-shaped cross-section defining a pair of facing sides of generally U-shaped cross-section and a center portion joining said facing sides and having said apertures therethrough, each of said U-shaped sides including a base and a pair of spaced ridges facing one another and extending substantially parallel to said base for defining an elongate slot facing a similar slot on the other of said U-shaped sides, a strip of resilient elastomeric material positioned against each of said bases and a generally T-shaped strip of substantially flexible low friction material positioned against each of said strips of elastomeric material extending outside of each of said elongate slots for resiliently supporting said frame members at the sides thereof, and for substantially sealing said frame members at and to said T-shaped strips.

14. The package as in claim 13 wherein each of said elongate guides further comprises a pair of longitudinally extending ridges on said center portion extending towards and abutting said chassis on opposed sides of said apertures for defining a cavity, and a strip positioned in said cavity and having therein holes of opening size at most as large as that of said apertures for controlling the rate of flow of the coolant passing through said coolant flow passages.

* * * * *